(12) United States Patent
Al-Araji et al.

(10) Patent No.: US 6,995,806 B1
(45) Date of Patent: Feb. 7, 2006

(54) AMPLIFIER WITH A UNIVERSAL AUTOMATIC GAIN CONTROL CIRCUIT

(75) Inventors: Saleh Al-Araji, Alpharetta, GA (US); John A. Ritchie, Jr., Duluth, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 1362 days.

(21) Appl. No.: 09/632,526

(22) Filed: Aug. 4, 2000

(51) Int. Cl.
*H04N 5/44* (2006.01)

(52) U.S. Cl. .............. 348/725; 725/149; 455/245.1; 455/247.1; 375/345

(58) Field of Classification Search .............. 348/678, 348/554, 725, 555; 375/345; 455/136, 245.1, 455/251.1, 246.1, 247.1; 725/149; H04N 5/44
See application file for complete search history.

(56) References Cited

U.S. PATENT DOCUMENTS

| | | | |
|---|---|---|---|
| 4,371,842 A | * | 2/1983 | Lee .............................. 330/141 |
| 4,434,439 A | | 2/1984 | Steckler et al. ............. 358/174 |
| 4,797,735 A | | 1/1989 | Takai et al. ................. 348/192 |
| 5,187,809 A | * | 2/1993 | Rich et al. ............... 455/234.2 |
| 5,293,405 A | | 3/1994 | Gersbach et al. ............. 375/14 |
| 5,408,698 A | | 4/1995 | Serizawa et al. ......... 455/245.1 |
| 5,565,932 A | | 10/1996 | Citta et al. .................. 348/678 |
| 6,725,463 B1 | * | 4/2004 | Birleson ...................... 725/151 |

FOREIGN PATENT DOCUMENTS

| | | |
|---|---|---|
| EP | 0769873 | 4/1997 |
| JP | 57143950 | 9/1982 |

* cited by examiner

Primary Examiner—Michael H. Lee

(57) ABSTRACT

An amplifier (125) includes a gain stage (210) for amplifying a signal received by the amplifier (125). The amplifier (125) also includes an AGC circuit (400) that adjusts the amplification of the gain stage (210) and that includes a comparator (440) for determining whether the input signal is one of a digital pilot signal and one of an analog pilot signal. The AGC circuit (400) processes both digital and analog pilot signals and automatically adjusts the processing method depending upon the type of pilot signal.

16 Claims, 4 Drawing Sheets

US 6,995,806 B1

AMPLIFIER WITH A UNIVERSAL AUTOMATIC GAIN CONTROL CIRCUIT

FIELD OF THE INVENTION

This invention relates generally to amplifiers, and more specifically to automatic gain control (AGC) circuits.

BACKGROUND OF THE INVENTION

A communication system 100, such as a two-way cable television system, is depicted in FIG. 1. The communication system 100 includes headend equipment 105 for generating forward signals that are transmitted in the downstream direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

Communication systems, as depicted in FIG. 1, often include amplifiers to boost signal levels, and automatic gain control (AGC) circuits within the amplifier are typically used to monitor and control the gain of such amplifiers.

FIG. 2 is an electrical block diagram of a conventional amplifier 125 that includes an AGC circuit. In operation, the amplifier 125 receives a forward signal from the upstream path at an input port 205. In conventional cable television systems, the forward signals being transmitted have been predominately analog channels. The forward signal is transmitted through one or more gain stages 210 for amplifying the forward signal. The amplified signal is then transmitted through a Bode circuit 215 that varies the signal level by attenuation. A final output gain stage 220 subsequently processes the forward signal, which is then transmitted to an output port 225. The output of the final gain stage 220 is also coupled to an AGC circuit 230 that is used to further control the attenuation of the Bode circuit 215 in response to the signal level of the amplified forward signal.

FIG. 3 is an electrical block diagram of the conventional AGC circuit 230 of FIG. 2. The AGC circuit 230 includes an input port for receiving the forward signal, which is also coupled to the amplifier output 225 of the final gain stage 220. The AGC circuit 230 includes a band pass filter 305 and a gain stage 310 for filtering and amplifying, respectively, the pilot signal. The filtered signal is then transmitted to an AM detector 315 that demodulates the signal to recover an analog video signal. Next, the demodulated analog video signal is amplified through a video amplifier 320.

A video peak detector 325 then samples the horizontal synchronization pulses of the demodulated video signal in order to establish a DC voltage that represents the peak carrier level. The peak detector 325 monitors the DC voltage of the horizontal synchronization pulses of the demodulated video signal to set and hold peak voltage values and to generate a peak voltage signal representative of the peak voltage values. This is generally done by storing the DC voltage values in a capacitor-resistor network between synchronization pulses.

The DC voltage signal provided by the peak detector 325 is compared with a thermal reference level by the integrator 330 to verify that the gain of the amplifier gain stages has remained constant. If the compared peak voltage signal has dropped below or risen above the predetermined thermal reference level, a thermal reference voltage signal from the reference voltage circuit 335 will be provided at the output of the AGC circuit 230 until such time as the voltage level of the pilot carrier signal level again equals the reference voltage level.

Again referring to the forward input signal to the AGC circuit 230, the input signal is filtered through the band pass filter 305 to allow a predetermined pilot carrier signal to pass. The pilot carrier signal is then demodulated and used, through comparison with the reference voltage level, to control the Bode circuit 215 (FIG. 2). The frequency of the pilot carrier signal is generally determined by selecting a median point between the lowest channel and the highest channel in the forward frequency spectrum, although the frequency of the pilot carrier may vary as long as the band pass filter 305 and other device components are configured to process a carrier signal of the desired frequency.

Historically, cable television systems have transmitted only analog signals, so transmission and processing of an analog pilot carrier signal by conventional analog AGC circuits has worked well. The cable television industry, however, is migrating to transmission of digital signals, so a pilot carrier signal in the digital frequency spectrum may, in the future, be chosen for processing through the AGC circuit. These digital signals are generally QAM modulated, and QAM modulated digital signals cannot be accurately processed by prior art AGC circuits, such as the AGC circuit 230 shown in FIG. 3. More specifically, the DC voltage values of the QAM modulated signals include complex, multi-level data having peak values at varying times and different rates, so peak detection in an AGC circuit does not provide useful or accurate information.

Thus, what is needed is an AGC circuit that can process a pilot carrier signal in the digital frequency spectrum to accurately generate a signal level control.

DETAILED DESCRIPTION OF A PREFERRED EMBODIMENT

As briefly mentioned in the Background of the Invention, communication systems often include amplifiers for boosting signal levels as signals are transmitted to remote subscribers. These amplifiers typically include automatic gain control (AGC) circuits for controlling signal levels, but conventional AGC circuits are not suitable for use with both analog and digital pilot signals. Instead, conventional AGC circuits are limited to processing analog input signals. With cable television systems migrating to a digital format, the amplifiers require an alternative AGC circuit to monitor and control amplifier gain using a digital input signal in addition to conventional analog input signals.

Figure 1:
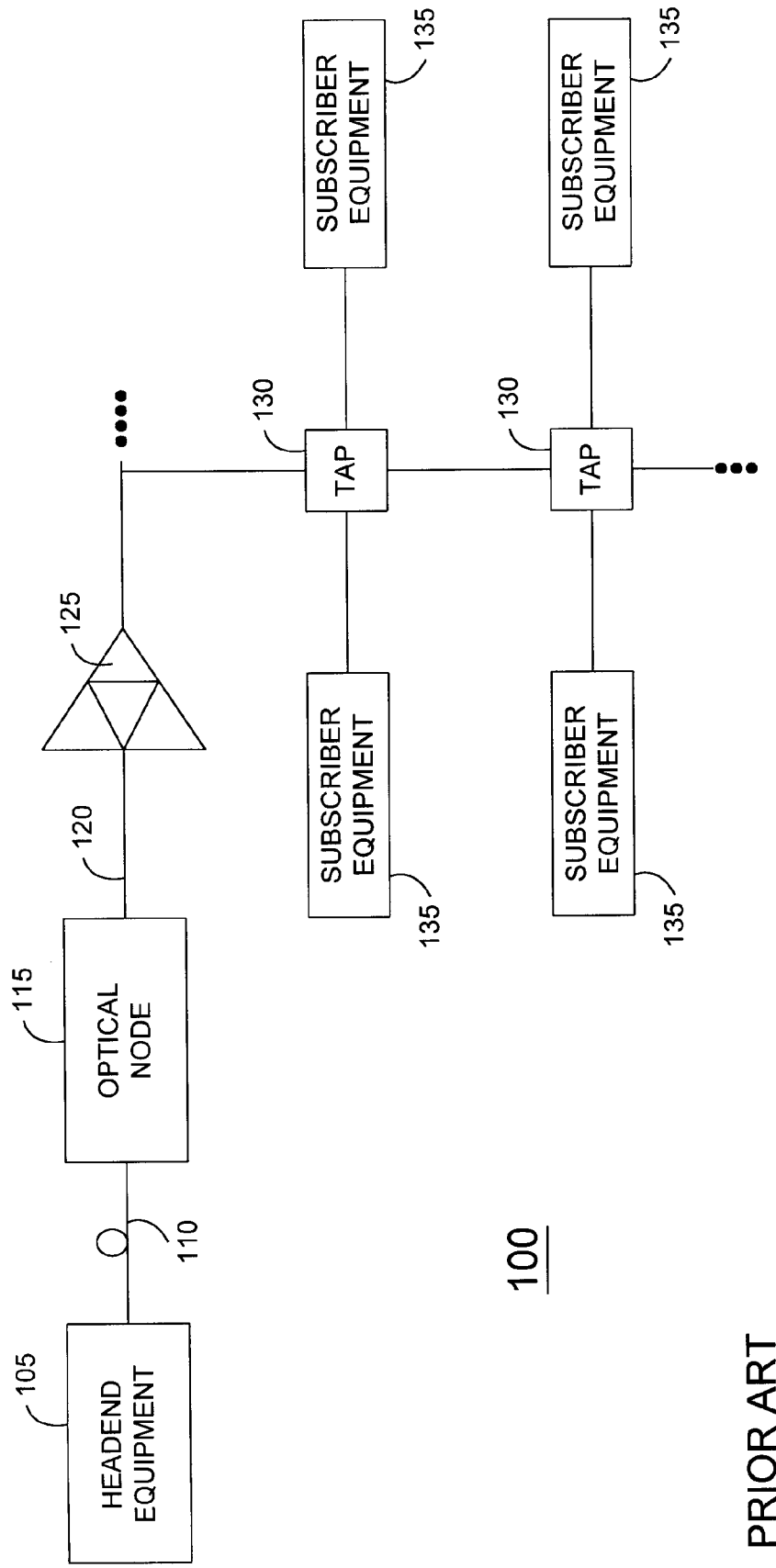
FIG. 1 is a block diagram of a conventional communication system, such as a cable television system.
Figure 2:
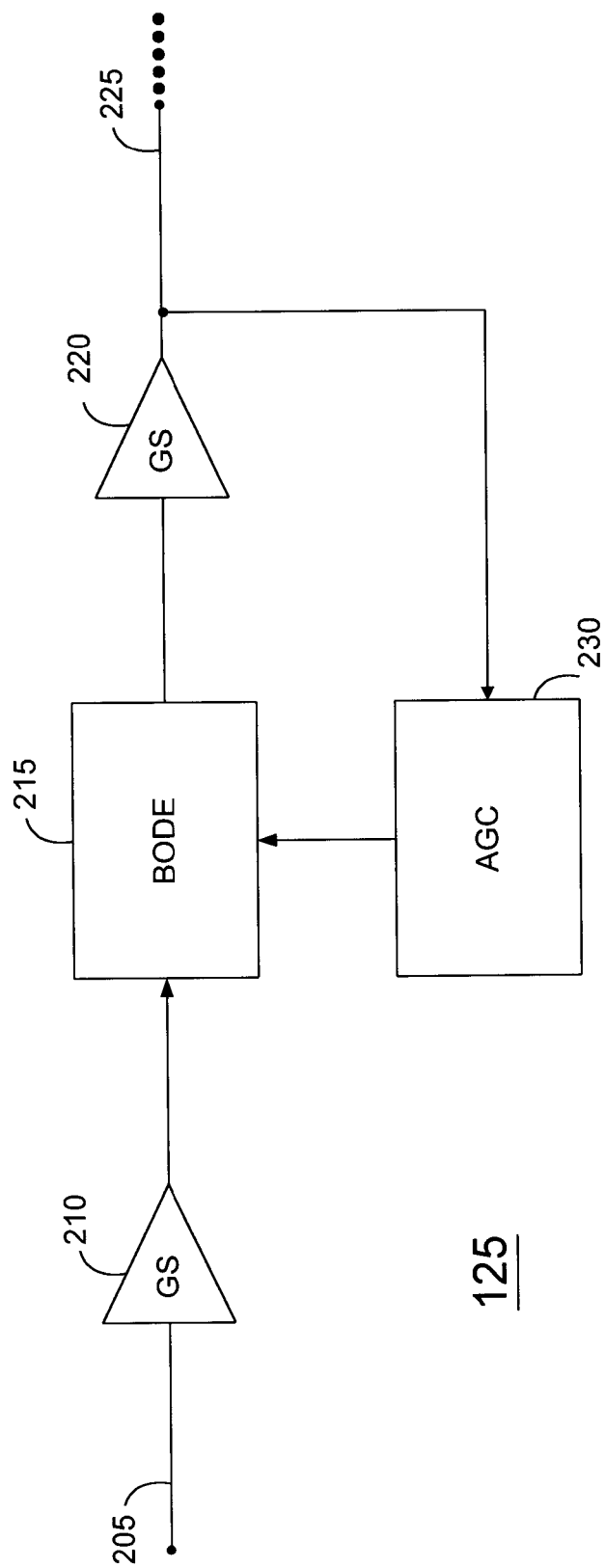
FIG. 2 is a block diagram of a conventional amplifier included in the communication system of FIG. 1.
Figure 3:
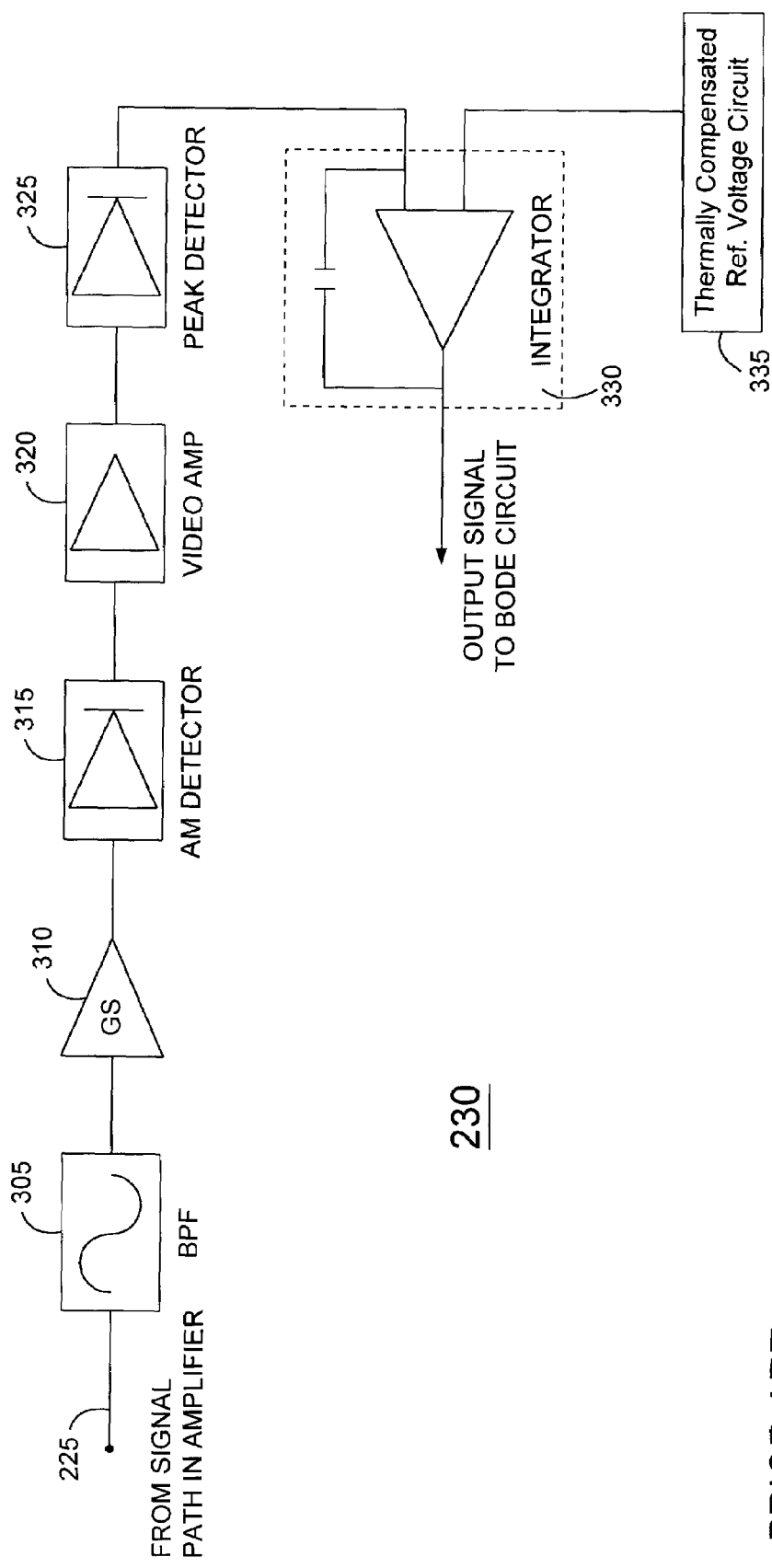
FIG. 3 is a block diagram of the conventional AGC circuit included in the amplifier of FIG. 2.
Figure 4:
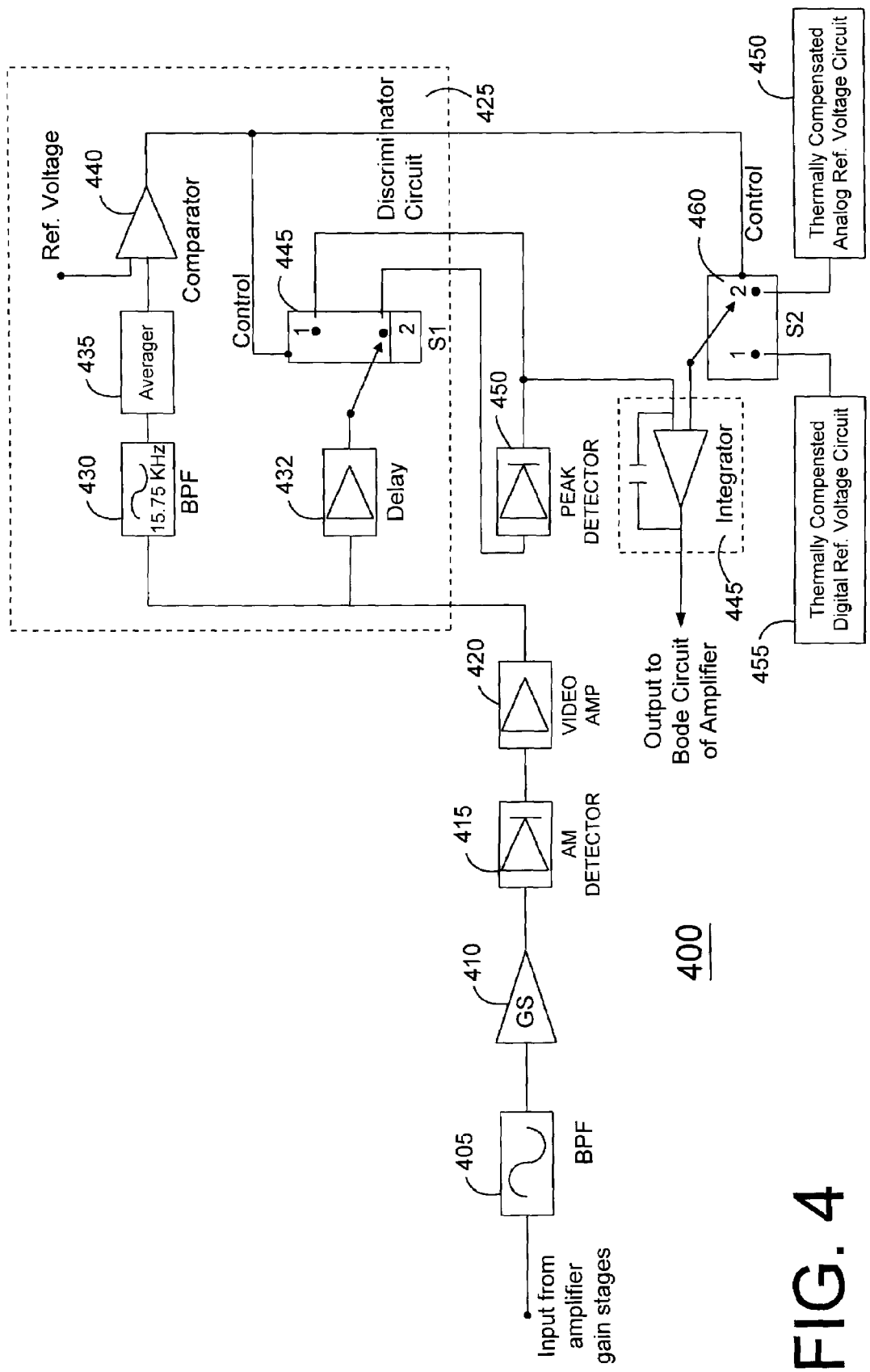
FIG. 4 is a block diagram of an AGC circuit for processing analog and digital signals in accordance with the present invention.

An advantage of the present invention is that an AGC circuit, which is depicted in FIG. 4, can be provided to discriminate between an analog forward signal and a digital forward signal and to use either for controlling gain levels within an amplifier. One of the functions of an AGC circuit is to capture a representative voltage of the input signal and compare that voltage with a reference signal. The AGC circuit of the present invention performs this function whether the input signal is analog or digital.

Referring to FIG. 4, the AGC circuit 400 in accordance with the present invention includes an input port that receives a forward input signal and that is coupled to the output of the gain stage of an amplifier. The forward input signal is transmitted through a band pass filter 405, which filters the input signal and allows a predetermined pilot carrier signal to pass through to a gain stage 410. The pilot carrier signal is normally AM modulated by an analog video signal which can be recovered using an AM detector 415, which also functions as an averager. Then, the demodulated video signal is amplified by the video amplifier 420.

Next, a digital/analog discriminator circuit 425 processes the video signal provided at the output of the video amplifier 420. As a result of processing by the discriminator circuit 425, an analog video signal is provided to a peak detector 450. The peak detector 450 then samples the synchronization pulses of the analog video signal in order to establish a DC voltage, which is then compared with a thermal reference level, as will be described in greater detail below.

However, if the input signal is digital, rather than being analog, the carrier signal will be digitally modulated, e.g., QAM modulated; therefore, the AM detector 415 and the video amplifier 420 have little effect, other than averaging the digital input signal, in representing a peak voltage for the peak detector 450 to capture for comparison. The AGC circuit 400 solves this problem by using the digital/analog discriminator circuit 425 to bypass the peak detector 450 when the pilot carrier signal is determined to be a digital signal.

The digital/analog discriminator circuit 425 includes a band pass filter 430 centered at the horizontal synchronization frequency of the input analog video signal. This frequency is 15.75 KHz for NTSC systems. The band pass filter 430 can be retuned to accommodate varying formats, e.g., PAL or SECAM, and various frequencies. In addition, a delay circuit 432 is coupled at the input of the band pass filter 430 to delay the video signal by a predetermined time to allow the digital/analog discriminator circuit 425 to process the received signal. Following the band pass filter 430 is an averaging circuit 435. The output of the averaging circuit 435 is delivered to a comparator 440. The comparator 440 compares the received amplitude of the analog horizontal synchronization pulses from the averaging circuit 435 with a reference voltage. This reference voltage is generally proportional to a value between the average value of the digital pilot signal and the average value of the horizontal synchronization pulses. Relative to the reference voltage, the presence of a strong horizontal synchronization pulse from the averaging circuit 435 signifies an analog modulated carrier signal; the presence of a weaker horizontal synchronization pulse from the averaging circuit 435 signifies a digitally modulated carrier signal.

One of ordinary skill in the art will appreciate that, when the AM detector 415 does not function as an averager, a separate averaging device should be included in the signal path of the AGC circuit 400. This separate averaging device can, for instance, be implemented through use of the integrator 445 and/or a conventional filter that may follow the integrator. Other conventional averaging devices could alternatively be used.

The output of the comparator 440 controls a switch 445. When the comparator 440 detects a strong signal from the averager 435, the output of the comparator 440 triggers the switch 445 to its second state and thereby routes the analog video signal from the delay circuit to the input of the peak detector 450. The peak detector 450 monitors the DC voltage of the demodulated video signal to set and hold peak voltage values and to generate a peak voltage signal representative of the peak voltage values. This is generally done by storing the DC voltage values in a capacitor-resistor network between synchronization pusles.

The DC voltage signal provided by the peak detector 450 is compared with a thermal reference level by the integrator 445 to verify that the gain of the amplifier gain stages has remained constant. If the compared peak voltage signal has dropped below or risen above the predetermined thermal reference level, a thermal reference voltage signal provided by a reference voltage circuit 450 is provided at the output of the AGC circuit 400 until such time as the voltage level of the pilot signal again equals the reference voltage level.

When the comparator 440 detects a weak signal, which is indicative of a digital input signal, the output of the comparator 440 triggers the switch 445 to its first state that then routes the digital video signal, bypassing the peak detector 450, to the input of the integrator 445. The averaged digital video signal is then compared to a thermal reference voltage signal at the integrator 445. If the compared averaged digital signal has dropped below or risen above the predetermined thermal reference level, a thermal digital reference voltage signal, provided by a digital reference voltage circuit 455, will be provided at the output of the AGC circuit 400 until such time as the voltage level of the pilot signal again equals the reference voltage level.

Referring to the thermally compensated reference voltages in FIG. 4, a switch 460 has a first state that represents a digital reference voltage level and a second state that represents an analog voltage reference level. This switch 460 can be operated in several methods, e.g., manually decided upon at the time of installation, or operated by an electronic switching circuit under control of the comparator 440 in the digital/analog discriminator circuit 425. It can also be appreciated that there may not be the need for two separate thermally compensated reference voltage circuits. Instead, the AGC circuit can include a single thermally compensated reference voltage circuit with a reference voltage that will satisfy both the digital and the analog signal constraints.

According to the present invention, a communication system, such as a cable television system, is able to use a single AGC circuit to monitor and control the gain of the amplifiers regardless of whether the forward signal is digital or analog. As a result, a system operator can install one AGC circuit at the time of amplifier deployment in order to increase flexibility in implementing digital communication systems. Consequently, installing an AGC circuit once, as opposed to visiting each amplifier and installing a new AGC circuit when an analog system begins to transmit digital signals, can save time and labor. Additionally, selection between processing of a digital pilot signal and processing of an analog pilot signal is automatic, and manual selection is not necessary.

In summary, the AGC circuit described above discriminates between an analog signal and a digital signal. It is therefore able to detect an analog modulated peak voltage, or alternatively, utilize an averager to average the digital signal which is a representation of the peak carrier level for the respective forward signals and, compare that voltage to a reference voltage. The AGC circuit then further controls the amplitude of the signal provided to the gain stages of the amplifier. As a result, alternative analog and digital signal level control circuits can conveniently operate within the same amplifier to detect and process analog and digital signals automatically, permitting a greater degree of flexibility than is currently the case for prior art signal level control circuits.

What is claimed is:

1. An automatic gain control (AGC) circuit, comprising:
   an input port for receiving an input signal that is one of a digital input signal and an analog input signal;
   a comparator coupled to the input port for determining which of the digital input signal and the analog input signal has been received;
   an averager for averaging the digital input signal to generate an average voltage signal when the input signal is determined to be digital;
   a peak detector for generating a peak voltage signal from the analog input signal when the input signal is determined to be analog; and
   an output port for providing the average voltage signal when the input signal is determined to be digital and for providing the peak voltage signal when the input signal is determined to be analog.

2. The AGC circuit of claim 1, wherein the comparator comprises:
   a first input for receiving the input signal;
   a second input for receiving a reference voltage; and
   an output for providing a control signal indicating which of the digital input signal and the analog input signal has been received.

3. The AGC circuit of claim 2, further comprising:
   a thermally compensated reference voltage circuit for generating reference voltage levels under control of the comparator.

4. The AGC circuit of claim 3, wherein the thermally compensated reference voltage circuit generates a digital reference voltage level when the input signal is determined to be digital, and wherein the thermally compensated reference voltage circuit generates an analog reference voltage level when the input signal is determined to be analog.

5. The AGC circuit in claim 1, further comprising:
   an integrator coupled to a thermally compensated reference voltage circuit for comparing the average voltage signal with the digital reference voltage level when the input signal is determined to be digital and for comparing the peak voltage signal with the analog reference voltage level when the input signal is determined to be analog.

6. The AGC circuit of claim 1, further comprising:
   a switch having first and second switch settings, wherein the switch is controlled by the comparator, wherein the first switch setting of the switch is activated when the input signal is determined to be digital and provides the average voltage signal to an integrator, and wherein the second switch setting of the switch is activated when the input signal is determined to be analog and provides the analog input signal to the peak detector.

7. An amplifier having automatic gain control (AGC) circuit, the amplifier comprising:
   at least one gain stage for amplifying a signal received by the amplifier, the gain stage comprising an input terminal and an output terminal;
   an AGC circuit for controlling attenuation of the signal in the gain stage, wherein an input of the AGC circuit is coupled to the output terminal of the gain stage for receiving a pilot signal with a video signal component and an output of the AGC circuit is coupled to the input terminal of the gain stage for providing a level control signal thereto, the AGC circuit comprising:
   a detector for demodulating the pilot signal to generate a demodulated signal;
   a comparator for receiving the demodulated signal, wherein the demodulated signal is one of a digital signal and an analog signal, and for determining which of the digital signal and the analog signal has been received;
   an averager for averaging the digital demodulated signal to generate an average voltage signal when the pilot signal is determined to be digital;
   a peak detector for generating a peak voltage signal from the demodulated signal when the pilot signal is determined to be analog; and
   an output port for providing the average voltage signal at the input terminal of the gain stage when the pilot signal is determined to be digital and for providing the peak voltage signal at the input terminal of the gain stage when the pilot signal is determined to be analog.

8. The amplifier of claim 7, further comprising:
   a thermally compensated reference voltage circuit for generating reference voltage levels under control of the comparator.

9. The amplifier of claim 7, further comprising:
   a switch having first and second switch settings, wherein the switch is controlled by the comparator, wherein the first switch setting of the switch generates a digital reference voltage level from a thermally compensated reference voltage circuit when the pilot signal is determined to be digital, and wherein the second switch setting of the switch generates an analog reference voltage level from the thermally compensated reference voltage circuit when the pilot signal is determined to be analog.

10. The amplifier of claim 7, further comprising:
    an integrator coupled to the switch for comparing the average voltage signal with the first switch setting when the pilot signal is determined to be digital and comparing the peak voltage signal with the second switch setting when the pilot signal is determined to be analog.

11. The amplifier of claim 10, wherein the integrator has an output to provide the level control signal.

12. A communication system for providing information, the communication system comprising:
    a transmitter for transmitting a signal including the information;
    a receiver for receiving the signal; and
    an amplifier coupled between the transmitter and the receiver for amplifying the signal, the amplifier comprising:
    a gain stage for amplifying the signal received by the amplifier; and
    an automatic gain control (AGC) circuit for controlling the attenuation of the signal in the gain stage, the AGC circuit comprising:
    an input port for receiving an input signal and an output port for providing an output signal;
    a comparator for determining when the input signal is a digital input signal and determining when the input signal is an analog input signal; and a thermally compensated reference voltage circuit for generating reference voltage levels under control of the comparator, wherein the AGC circuit automatically controls the attenuation of the signal in the gain stage when the input signal is digital and when the input signal is analog.

13. The communication system of claim 12, wherein the AGC circuit further comprises:
- an averager for averaging the digital input signal to generate an average voltage signal; and
- a peak detector for generating a peak voltage signal from the analog input signal.

14. The communication system of claim 12, wherein the thermally compensated reference voltage circuit generates a digital reference voltage level when the input signal is determined to be digital and an analog reference voltage level when the input signal is determined to be analog.

15. The communication system of claim 12, wherein the AGC circuit further comprises an integrator coupled to the thermally compensated reference voltage circuit comparing the average voltage signal and the digital reference voltage level when the input signal is determined to be digital and comparing the peak voltage signal and the analog reference voltage level when the input signal is determined to be analog.

16. The communication system of claim 15, wherein the integrator has an output to provide the output signal that controls the signal level.

* * * * *